(12) United States Patent
Eguchi et al.

(10) Patent No.: US 8,782,478 B2
(45) Date of Patent: Jul. 15, 2014

(54) NON-VOLATILE MEMORY (NVM) WITH IMMINENT ERROR PREDICTION

(71) Applicants: Richard K. Eguchi, Austin, TX (US); Daniel Hadad, Austin, TX (US); Chen He, Austin, TX (US); Katrina M. Prosperi, Austin, TX (US); Jon W. Weilmann, II, Austin, TX (US)

(72) Inventors: Richard K. Eguchi, Austin, TX (US); Daniel Hadad, Austin, TX (US); Chen He, Austin, TX (US); Katrina M. Prosperi, Austin, TX (US); Jon W. Weilmann, II, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/048,362

(22) Filed: Oct. 8, 2013

(65) Prior Publication Data

US 2014/0040687 A1 Feb. 6, 2014

Related U.S. Application Data

(62) Division of application No. 12/886,861, filed on Sep. 21, 2010, now Pat. No. 8,572,445.

(51) Int. Cl.
*G11C 29/00* (2006.01)

(52) U.S. Cl.
USPC ............ 714/721; 365/200; 365/201; 714/758

(58) Field of Classification Search
USPC ........................... 714/721, 758; 365/200, 201
See application file for complete search history.

(56) References Cited

U.S. PATENT DOCUMENTS

| 6,226,200 | B1 | 5/2001 | Eguchi | |
|---|---|---|---|---|
| 7,370,260 | B2 | 5/2005 | Nahas | |
| 7,450,425 | B2 | 11/2008 | Aritome | |
| 7,865,797 | B2 | 1/2011 | Eguchi | |
| 8,095,836 | B2 | 1/2012 | Eguchi | |
| 2005/0120265 | A1 | 6/2005 | Pline | |
| 2005/0286336 | A1* | 12/2005 | Harari et al. | 365/232 |
| 2007/0174740 | A1* | 7/2007 | Kanno | 714/54 |
| 2010/0067302 | A1* | 3/2010 | Furuta et al. | 365/185.18 |
| 2010/0157750 | A1* | 6/2010 | Chen et al. | 369/47.14 |
| 2010/0254194 | A1* | 10/2010 | Chou et al. | 365/185.21 |
| 2011/0016371 | A1* | 1/2011 | Sakimura et al. | 714/763 |
| 2011/0161775 | A1* | 6/2011 | Weingarten | 714/755 |

* cited by examiner

*Primary Examiner* — Guy Lamarre
(74) *Attorney, Agent, or Firm* — Yudell Isidore Ng Russell PLLC (57) ABSTRACT

A non-volatile memory system includes a memory array and a memory controller. The memory controller is configured to perform a first array integrity read operation of the array until an error is detected. The controller is also configured to determine that the error is not error correction code (ECC) correctable. A first word line voltage associated with the error is characterized as being a first threshold voltage. The controller is further configured to perform a second array integrity read operation of the array. The second array integrity read operation includes reading the array with a word line read voltage that is offset from the first threshold voltage and is based on a predetermined width offset reference value. Finally, the controller is configured to check a check sum value resulting from the second array integrity read operation to determine when an imminent failure in the memory array is indicated.

18 Claims, 6 Drawing Sheets

NON-VOLATILE MEMORY (NVM) WITH IMMINENT ERROR PREDICTION

This application is a divisional of U.S. patent application Ser. No. 12/886,861, filed Sep. 21, 2010, titled "NON-VOLATILE MEMORY (NVM) WITH IMMINENT ERROR PREDICTION," naming Richard Eguchi et al. as inventors and assigned to the current assignee hereof, the disclosure of which is hereby incorporated herein by reference in its entirety for all purposes.

This application is related to U.S. patent application Ser. No. 12/608,405, filed Oct. 29, 2009, titled "THRESHOLD VOLTAGE TECHNIQUES FOR DETECTING AN IMMINENT READ FAILURE IN A MEMORY ARRAY," naming Richard K. Eguchi et al. as inventors, and assigned to the current assignee hereof, and This application is related to U.S. patent application Ser. No. 12/608,476, filed Oct. 29, 2009, titled "TIME-BASED TECHNIQUES FOR DETECTING AN IMMINENT READ FAILURE IN A MEMORY ARRAY," naming Richard K. Eguchi, Thomas S. Harp et al. as inventors, and assigned to the current assignee hereof.

BACKGROUND

1. Field

This disclosure relates generally to non-volatile memories (NVMs), and more specifically, to imminent error prediction of memory cells of the NVMs.

2. Related Art

Non-volatile memories (NVMs) have a limited endurance. Much work has been done to increase this endurance, but there is currently no expectation of this endurance having no limit. An NVM is typically specified with a certain endurance that the NVM is guaranteed to meet which sets an expectation to the user. Individual NVMs will vary from this specified amount so that a few may not even meet the specified endurance whereas the others will exceed it and sometimes greatly exceed it. A user may keep using the NVM beyond the specified endurance unintentionally or even intentionally. In either case and even in the case where the NVM does not meet the specified endurance, as a result of a latent defect for example, it would be beneficial to warn the user of an imminent failure so that actions can be taken in advance of the actual failure. It is important that the prediction be accurate because a false alarm could result in actions being taken that are unnecessary. Also if there is an expectation of a warning, an actual failure without the warning could result in increased adverse affects because of the expectation of the warning.

Accordingly, it is desirable to provide imminent failure warning for an NVM that improves upon one or more of the issues described above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an NVM system includes determining if there is imminent danger of a memory cell short. These type of shorts include catastrophic cases where the memory block becomes inoperable due to a short from word line to drain or word line to source. This may be conveniently used in combination with detecting if there are enough marginal NVM array cells so that if they were in the wrong state, which is imminent, there would be too much for error correction code (ECC) to be effective. This is better understood by reference to the drawings and the following description.

Figure 1:
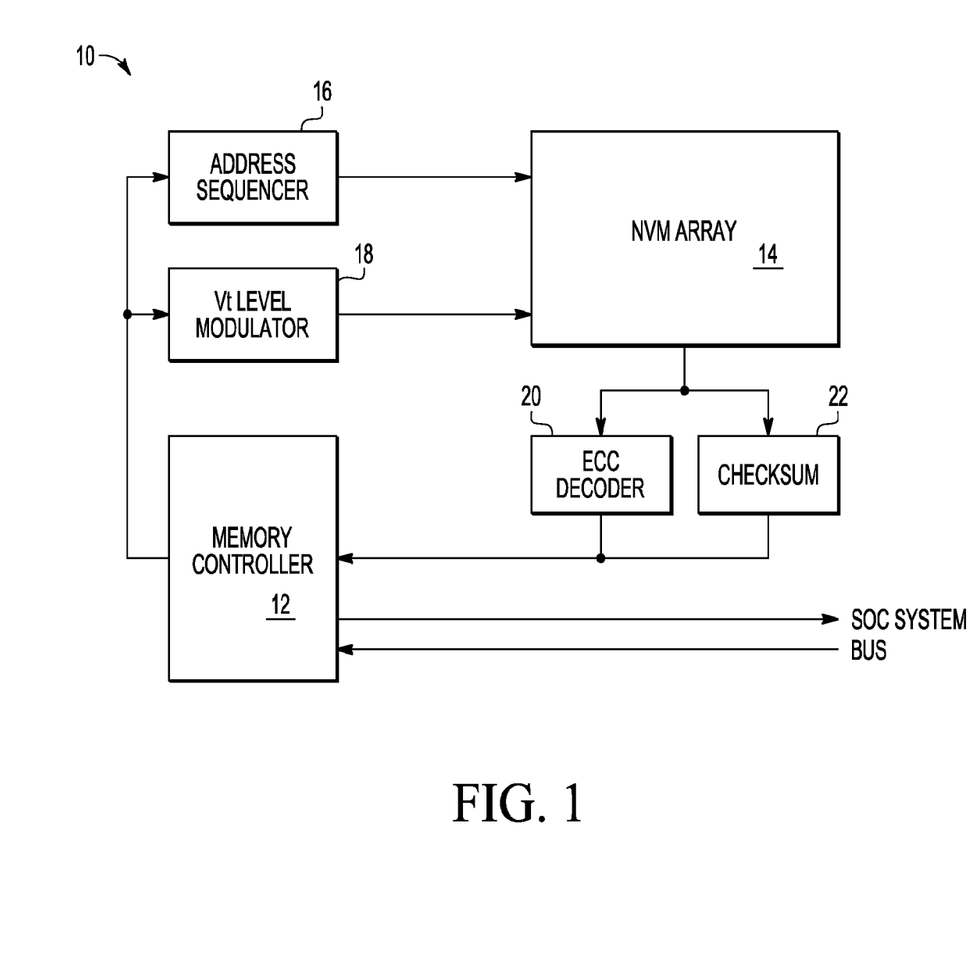
FIG. 1 is a diagram of a system having an NVM array having imminent error prediction.

Shown in FIG. 1 is an NVM system 10 including a memory controller 12, an NVM array 14, an address sequencer 16, a threshold voltage (Vt read level) modulator 18, an ECC decoder 20, and a check sum 22. The inputs and outputs as shown in FIG. 1 are multi-bit. Memory controller 12 controls operation of NVM array 14. NVM array 14 has a first input coupled to an output of address sequencer 16, a second input coupled to an output of Vt level modulator, and an output coupled to an input of ECC decoder 20 and an input of check sum 22. Memory controller 12 has a first output coupled to the inputs of Vt level modulator 18 and address sequencer 16, a first input coupled to outputs of ECC decoder 20 and check sum 22. Memory controller 12 also has an input and an output coupled to a system bus of a larger system such as a system on a chip (SOC).

Figure 2:
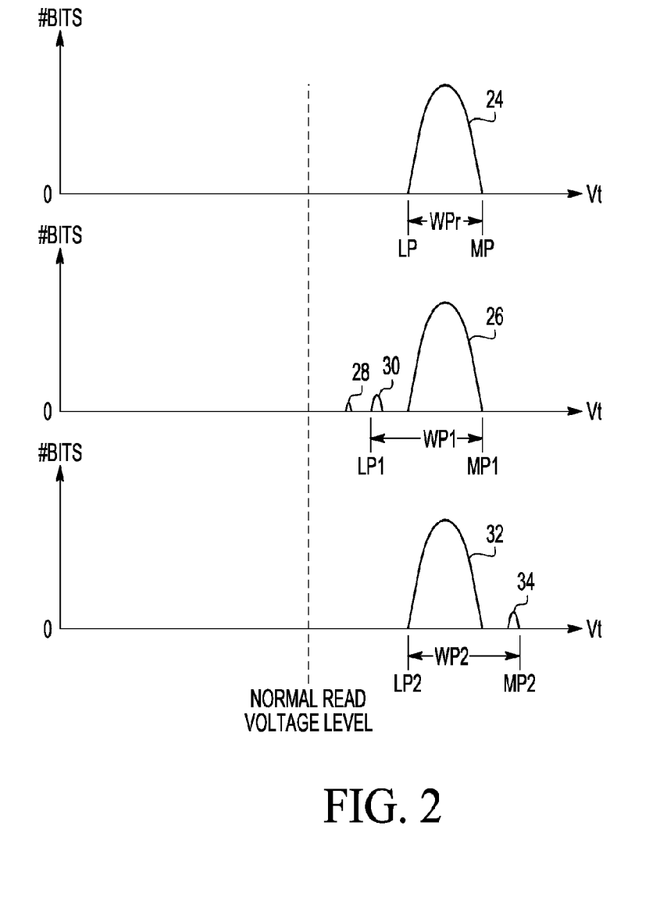
FIG. 2 is a graph useful in understanding the operation of the system of FIG. 1 regarding programmed memory cells in the NVM array of the system of FIG. 1.

Shown in FIG. 2 is a distribution of programmed bits 24 of NVM array 14 showing all of the bits that are programmed to a threshold voltage (Vt) distribution between a lowest programmed intrinsic Vt (LP) and a most programmed Vt MP so that the distribution width WPr which is substantially the same as a reference width of distribution. As shown WPr=MP−LP. The reference width is determined by a taking data for successfully programmed memory cells and determining the typical distribution. With process variations the location of LP and MP changes somewhat but the difference, width WPr, between MP and LP remains more constant. The programming is done to achieve a normal read margin such that LP is above the normal read level which is a predetermined voltage level on the word lines that is used for performing a read during normal device operation. Eventually with enough program/erase cycles or due to a latent defect, memory cells will begin to degrade in their ability to be programmed and/or erased. In the case of distributions as shown in FIG. 2, one of the deleterious affects that may happen is that some bits may be programmed or shifted to a lesser Vt. This is shown with a distribution 26, which in this example is substantially the same as distribution 24, and further distributions 28 and 30 that have relatively few bits. Distributions 28 and 30 could be single cells. For the case where distribution 28 represents the only bits outside of distribution 26 and these bits are correctable by ECC decoder 20, even if they were failed bits at a given Vt read voltage, there would not be an expectation of an imminent failure of NVM array 14. On the other hand, with the addition of distribution 30 being outside of main distribution 26, and those in combination with distribution 28 would not be correctable by ECC decoder 20 if both distributions 28 and 30 were in the wrong state at a given Vt read voltage, then an imminent failure is present. The threshold voltage of distribution 30 then becomes the least programmed intrinsic Vt (LP1). The most programmed Vt is MP1 and the distribution width is WP1 for this case. Memory controller 12 runs a diagnostic on NVM array 14 to make this determination by comparing width WP1 and with width WPr. If the difference is sufficiently great, then an error is imminent. Another failure is for a memory cell to have an exceptionally high Vt. This is shown with a main distribution 32, which in this example is substantially the same as distribution 24, and a distribution 34 having a higher Vt outside distribution 32 that has relatively few bits. Distribution 34 could be a single cell. In this case, the Vt of distribution 34 is determined when all bits in NVM array 14 read as all erased at that Vt read voltage, which becomes the most programmed Vt (MP2) for this case. The least programmed intrinsic Vt for this case is LP2 and the distribution width is WP2 for this case. Memory controller 12 runs a diagnostic on NVM array 14 to make this determination by comparing width WP2 and with width WPr. If the difference is sufficiently great, then an error is imminent. An exceptionally high threshold voltage outside the main distribution is an indicator that a catastrophic failure of that memory cell is imminent. The type of failure that is imminent is a short circuit which will prevent the program/erase circuit from functioning properly and thus rendering a portion of the NVM inoperable.

Figure 3:
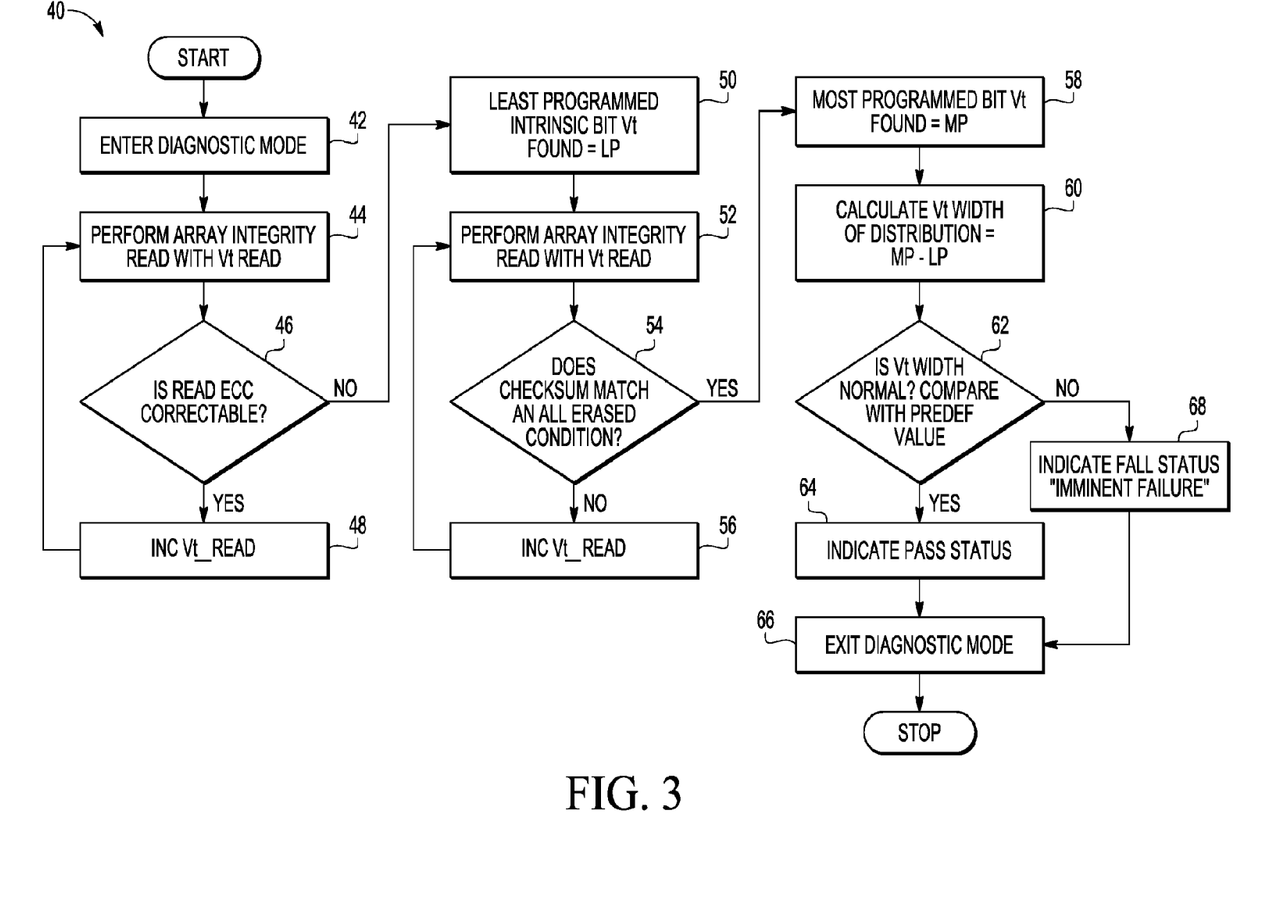
FIG. 3 is a flow diagram describing an operation of the system of FIG. 1 for determining imminent failures in programmed cells.

Shown in FIG. 3 is a flow chart showing how memory controller 12 runs NVM array 14 to determine the distribution of programmed bits and performing comparison of the width of the actual distribution to the width of the reference distribution to determine if an error is imminent. At step 42 a diagnostic mode is entered and at step 44 an array integrity read is performed using a Vt read level typically starting from the normal read level. The Vt read voltage typically applies to the word line of NVM array 14, therefore it is also referred as the word line voltage. Memory controller 12 uses address sequencer 16 in performing this task. If no uncorrectable ECC errors are found, indicating that either all bits are read as expected, or any errors (bits with unexpected values) found can be corrected by ECC, then at step 48 Vt read level is incremented. The incremented Vt read level is then used to read the array at step 44. At step 46 again a determination is made if there are any uncorrectable ECC errors. If not, Vt read level is again incremented by memory controller 12 using Vt level modulator 18 and the NVM array is read again at the incremented Vt read level. Memory controller 12 again determines if any uncorrectable ECC errors are found. This iterative process of increasing the Vt read voltage and testing continues until an uncorrectable ECC error is found. The Vt read level at which this first uncorrectable ECC read error occurs is the least programmed intrinsic Vt which is LP in distribution 24, LP1 for distributions 26, 28, and 30, and LP2 for distributions 32 and 34. This information is then stored as shown in step 50.

The process continues by applying Vt read level, beginning using the last value used in step 44 to perform an array integrity read as in step 52 but now testing, in step 54, to determine if NVM array 14 is in an all erased condition. This is achieved using checksum 22 in this example. The checksum logic is designed to have a unique value for all erased state and a unique value for all programmed state, and both values will be different from the ones for all other array states. The checksum is a faster way to check if all bits in the array are erased or programmed. In another embodiment, such check can be done by reading and compare to expected value for one address at a time. If they are not in the all erased condition, Vt read level is further incremented as shown in step 56 and the array integrity read is performed again. This iterative process continues until checksum 22 indicates to memory controller 12 that the all bits are read as erased. When this occurs, the Vt of the most programmed bit has been found and this information is stored as shown in step 58. The point at which this occurs is MP for distribution 24, MP1 for distributions 26, 28, and 30, and MP2 for distributions 32 and 34.

As shown in step 60, a width of the actual distribution is calculated by subtracting the Vt read level at the actual least programmed intrinsic location (actual LP) from the Vt read level at the most programmed location (actual MP). At step 62 this actual width is compared to the reference value, WPr. The reference value may be established from accumulated data. An alternative is to use a width value determined from NVM array 14 itself at production test flow or some other appropriate stage early in its program/erase cycles. If the comparison indicates a sufficiently small difference that there is no imminent error on the programmed side, then in step 64 a pass is indicated and the diagnostic mode is exited. On the other hand if the comparison indicates a sufficiently large difference that there is an imminent error, then in step 68 an "imminent failure" is indicated as the status and the diagnostic mode is exited.

Using the width of the distribution as the comparison is beneficial because the width of the good distribution changes relatively little with process variations. Also this takes into account the imminent errors that are indicated by an excessively high Vt of bits or uncorrectable ECC errors.

Figure 4:
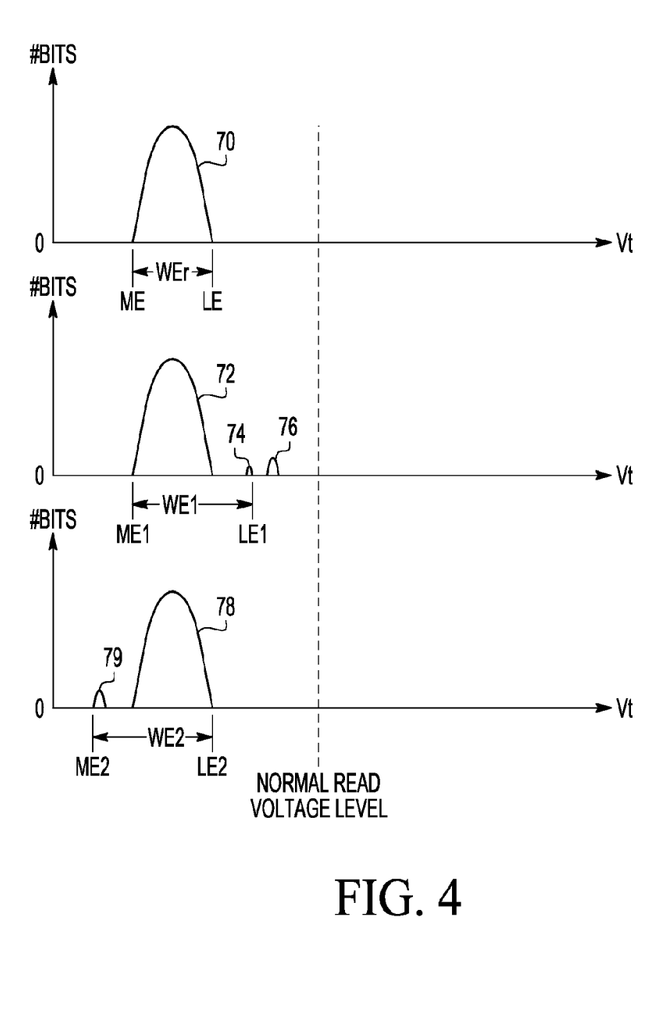
FIG. 4 is a graph useful in understanding the operation of the system of FIG. 1 regarding erased memory cells in the NVM array of the system of FIG. 1.

Shown in FIG. 4 are three distributions similar to those shown in FIG. 2 but for the erased condition. Distribution 70 is a reference distribution showing the least erased intrinsic Vt LE nearer to the normal read line than the most erased Vt ME. The difference between ME and LE is the reference width WEr (WEr=LE−ME). Also shown is a main distribution 72 and two smaller distributions 74 and 76, being less erased than main distribution 72, that may occur in NVM array 14. Distributions 74 and 76 could be single cells. This shows a width of WE1 in which the least erased intrinsic Vt LE1 is at the distribution 74 indicating that distribution 76 is ECC correctable if it were in the wrong state but the combination of distribution 74 and 76 would not be if they both were in the wrong state at a Vt read level. Also shown is another alternative for NVM array 14 showing a main distribution 78 and a smaller distribution 79 which has a more erased condition than main distribution 78. Distribution 79 could be a single cell. In this case the most erased Vt ME2 is at the distribution 79. A memory cell that is significantly more in the erased condition than the normal distribution is a memory cell that is about to become short circuited and thus cause a failure for circuitry used for other memory cells.

Figure 5:
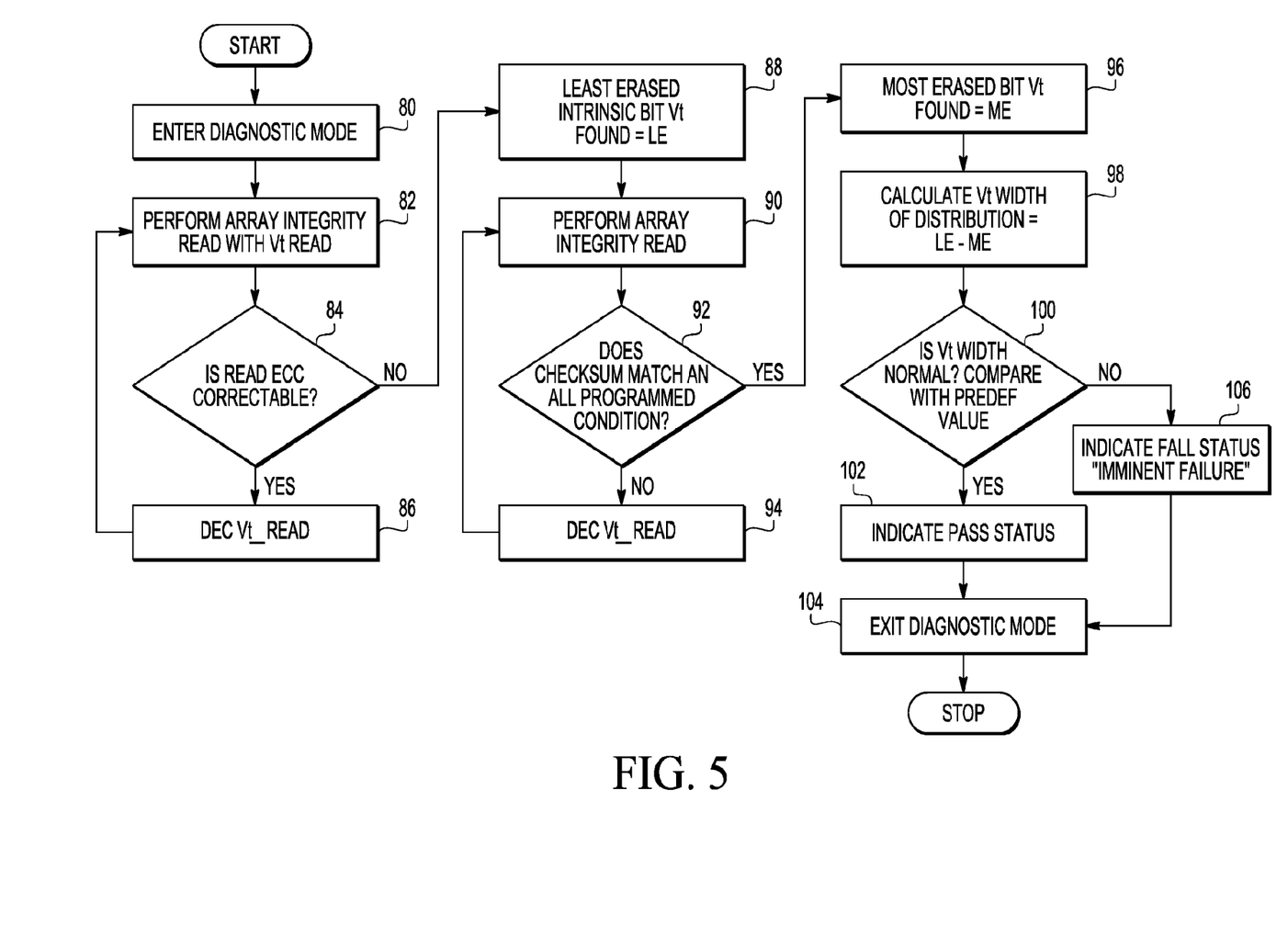
FIG. 5 is a flow diagram describing an operation of the system of FIG. 1 for determining imminent failures in erased cells.

Shown in FIG. 5 is a flow chart similar to flow chart 40 performed by memory controller 12, but it is for the erased bits. After entering the diagnostic mode in step 80, an array integrity read is performed using a Vt read level, typically starting from the normal read level, at step 82. If no uncorrectable ECC errors are found, indicating that either all bits are read as expected, or any errors (bits with unexpected values) found can be corrected by ECC, then at step 86 Vt read level is decremented. The decremented Vt read level is then used to read the array at step 82. At step 84 again a determination is made if there are any uncorrectable ECC errors. If not, Vt read level is again decremented and the NVM array is read. Memory controller 12 again determines if any uncorrectable ECC errors are found. This iterative process of decreasing the Vt read voltage and testing continues until an uncorrectable ECC error is found. The Vt read level at which this first occurs is the least erased intrinsic Vt which is LE in distribution 70, LE1 for distributions 72, 74, and 76, and LE2 for distributions 78 and 79. This information is then stored as shown in step 88.

The process continues by applying Vt read level, beginning using the last value used in step 82 to perform an array integrity read as in step 90 but now testing, in step 92, to determine if NVM array 14 is in an all programmed condition. In one embodiment, this is achieved using checksum 22. In another embodiment, such check can be done by reading and compare to expected value for one address at a time. If they are not in the all programmed condition, Vt read level is further decremented as shown in step 94 and the array integrity read is performed again. This iterative process continues until checksum 22 indicates that the all bits are read as programmed. When this occurs, the Vt of the most erased bit has been found and this information is stored as shown in step 96. In the case of distributions 72, 74, and 76, the stored value is ME1. In the case of distributions 78 and 79, the stored value is ME2. At step 98, the actual width is calculated by subtracting the actual ME from the actual LE and then at step 100 is compared to the reference width. If the actual width is sufficiently close to the reference width WEr, a pass is indicated at step 102 and the diagnostic mode is exited at step 104. If the actual width is sufficiently different from the reference width, then an imminent failure is indicated at step 106 and the diagnostic mode is exited in step 104.

The programmed and erased states are analogous with regard to imminent failure detection. An NVM array typically contains both erased and programmed memory cells. Therefore, typically both the flows shown in FIG. 3 and FIG. 5 need to executed on an NVM array to check the Vt width of both programmed and erased cells.

Figure 6:
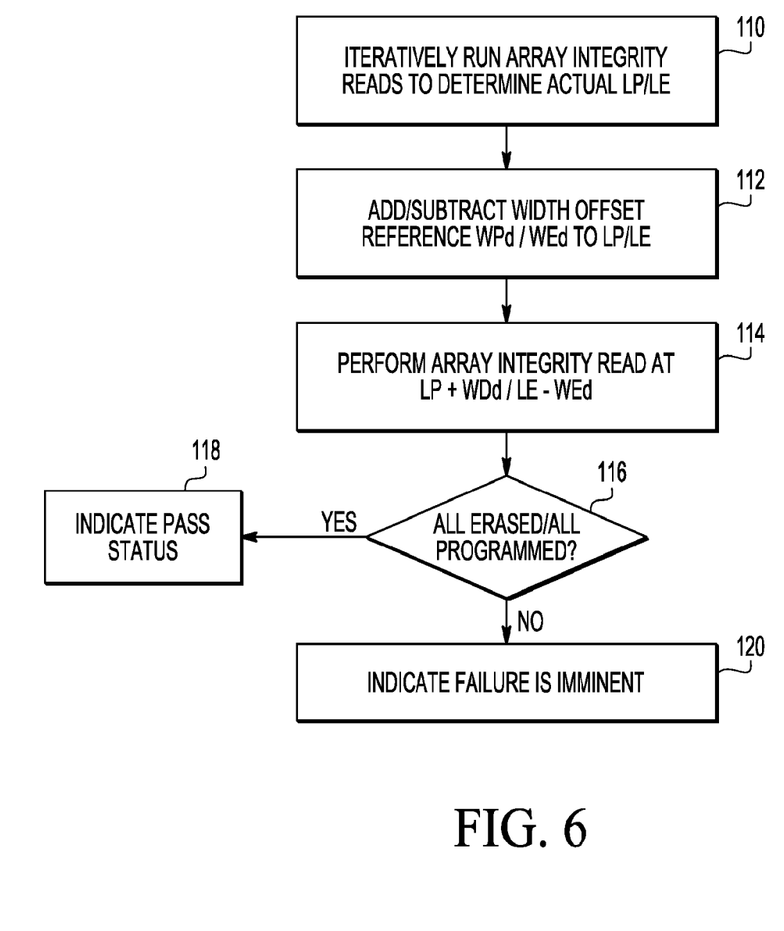
FIG. 6 is a flow diagram describing another operation of the system of FIG. 1 for determining imminent failures in both programmed and erased cells.

There is an alternative that is a way to reduce the diagnostic time but at the loss of obtaining characterization data as shown in FIG. 6. Note that FIG. 6 shows the operation for both programmed condition and erased condition. The references on the left side of "/" are corresponding to the programmed condition, and the references on the right side of "/" are corresponding to the erased condition. After the least programmed instrinsic Vt, LP, or least erased intrinsic Vt, LE, has been determined using above methods, the next array integrity read may be performed at the Vt read level determined using the reference widths which are analogous to WPr and WEr as shown in FIGS. 2 and 4. We define the program width offset reference as WPd, which is equal to WPr plus a predetermined margin. We define the erase width offset reference as WEd, which is equal to WEr plus a predetermined margin. So in that sense the program and erase width offset references WPd and WEd would differ from WPr and WEr in that there would be added margin. This can be viewed as shown in FIG. 6, steps 110 and 112, where step 110 determines the actual LP and LE and step 112 adds the program width offset reference, WPd, to the actual LP and subtracts the erase width offset reference, WEd, from the actual LE. One way this could be implemented for the programmed memory cells is that the Vt read level of the next integrity read, step 114, would be at the least programmed intrinsic Vt, LP, plus the program width offset reference, WPd. Then if the checksum determines that all bits are read as erased at this Vt read level, step 116, then it is known that none of the memory cells are imminent failures on the programmed side, step 118. If the checksum determines that not all bits are read as erased at this Vt read level, step 116, then it is known there is at least one memory cell that has too high of a threshold voltage and thus an indication of imminent failure would be generated, step 120. In this approach, the actual MP is not found but it is known if the actual MP exceeds the LP plus the reference width, WPd. Checking the erased memory cells would be done analogously with the actual LE being determined, the erase width offset reference WEd, subtracted, and the integrity read performed. If the checksum indicates that all bits read as programmed, then there is no imminent failure on the erased side, but if the checksum indicates a not all programmed state, then an imminent failure indication is generated because it is certain that a memory cell has too low of a threshold voltage and is in imminent danger of failing. This same principle can be used as a stopping point while still collecting characterization data. The processes as indicated in steps 52, 54, and 56 and steps 90, 92, and 94 would be performed but incrementing would be stopped if it reached the actual LP plus the reference width or LE minus the reference width. No further integrity reads are required because it is then known if there is memory cell with either too great or too low of a threshold voltage under the same reasoning applied immediately above.

By now it should be appreciated that there has been provided a method for determining an imminent failure of a non-volatile memory array. The method includes performing a first array integrity read of the non-volatile memory array until an error is detected. The method further includes determining that the error is not error correction code (ECC) correctable, wherein a first word line voltage associated with the error is characterized as being a first threshold voltage. The method further includes performing a second array integrity read of the memory array until all bits of the memory array indicate a predetermined state, wherein a second word line voltage associated with all of the bits being the predetermined state is a second threshold voltage. The method further includes comparing a difference between the first and second threshold voltages to a predetermined value. The method may have a further characterization by which the first array integrity read indicates a read error. The method may have a further characterization by which the method is performed during a diagnostic mode of the non-volatile memory array. The method may have a further characterization by which the first array integrity read is accomplished by performing read operations of the memory array while sweeping a word line read voltage from an initial word line voltage to the first word line voltage. The method may have a further characterization by which performing the second array integrity read of the non-volatile memory array until all bits of the non-volatile memory array indicate a predetermined state further comprises checking a check sum value to determine when all bits of the non-volatile memory array indicate the predetermined state. The method may have a further characterization by which checking the check sum value further comprises the check sum value being a first value when all bits of the non-volatile memory array are programmed, and the check sum value being a second value when all bits of the memory array are erased, wherein the first value is not equal to the second value, wherein the first value and the second value are different from any other checksum value associated with the memory array. The method may have a further characterization by which comparing the difference between the first and second threshold voltages to the predetermined value further comprises indicating the imminent failure of the non-volatile memory array when the difference between the first and second threshold voltage is outside a predetermined range based on the predetermined value. The method may have a further characterization by which the second array integrity read is accomplished by performing read operations of the non-volatile memory array while sweeping a word line read voltage from the first word line voltage to the second word line voltage. The method may have a further characterization by which performing a second array integrity read of the non-volatile memory array until all bits of the non-volatile memory array indicate a predetermined state further comprises reading all array locations and comparing logic states of the read locations to the predetermined state.

Also disclosed is a method for determining an imminent failure of a non-volatile memory array. The method includes performing a first array integrity read operation of the non-volatile memory array until an error is detected. The method further includes determining that the error is not error correction code (ECC) correctable, wherein a first word line voltage associated with the error is characterized as being a first threshold voltage. The method further includes performing a second array integrity read operation of the non-volatile memory array, the second array integrity read operation comprising reading the array with a word line read voltage that is offset from the first threshold voltage and based on a predetermined width offset reference value. The method further includes checking a check sum value resulting from the second array integrity read operation, wherein when the check sum value is equal to a predetermined check sum value, there is not imminent failure in the memory array, and wherein when the check sum value is not equal to the predetermined check sum value, then there is imminent failure in the non-volatile memory array. The method may have a further characterization by which the first array integrity read operation is accomplished by performing read operations of the non-volatile memory array while sweeping the word line read voltage within a predetermined range. The method may have a further characterization by which checking the check sum value further comprises the check sum value being a first value when all bits of the non-volatile memory array are programmed, and the check sum value being a second value when all bits of the non-volatile memory array are erased, wherein the first value is not equal to the second value and wherein the first value and the second value are different from any other checksum value associated with the memory array. The method may have a further characterization by which the predetermined width offset reference value is based on a predefined threshold voltage width including a margin. The method may have a further characterization by which the method is performed during a diagnostic mode of the non-volatile memory array. The method may further include storing the first threshold voltage and the predetermined width offset reference value in predetermined locations of the non-volatile memory array.

Disclosed also is a system. The system includes a memory array having a plurality of memory cells, each memory cell of the plurality of memory cells coupled to a word line and a bit line. The system further includes a threshold voltage modulator coupled to the word line, the threshold voltage modulator for providing a range of voltage levels to the word line during a diagnostic mode of the system. The system further includes an error correction code (ECC) decoder coupled to the memory array. The system further includes a memory controller coupled to the memory array, the threshold voltage modulator, and the ECC decoder, the memory controller for controlling a first array integrity read operation of the memory array until a read error is detected, the memory controller for determining that the read error is not ECC correctable, wherein a first word line voltage associated with the read error is characterized as being a first threshold voltage, the memory controller for controlling a second array integrity read operation of the memory array until all bits of the memory array indicate a predetermined state, wherein a second word line voltage associated with all of the bits indicating the predetermined state is a second threshold voltage, and the memory controller for comparing a difference between the first and second threshold voltages to a predetermined value. The system may have a further characterization by which the memory controller is further characterized as being for indicating an imminent failure of the memory array when the difference between the first and second threshold voltage is greater than the predetermined value. The system may have a further characterization by which the memory array comprises a plurality of flash memory cells. The system may further comprise an address sequencer coupled to the memory array, the address sequencer for selecting each of the plurality of memory cells during the first and second array integrity read operations. The system may further comprise a check sum register coupled to the memory array, a check sum value stored in the check sum register is used to determine when all bits of the memory array indicate the predetermined state.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling. The term "cells", "memory cells" and "bits" are used interchangeably herein and they all refer to the memory bit cells in NVM array.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for determining an imminent failure of a non-volatile memory array, the method comprising:
   performing a first array integrity read operation of the non-volatile memory array until an error is detected;
   determining that the error is not error correction code (ECC) correctable, wherein a first word line voltage associated with the error is characterized as being a first threshold voltage;
   performing a second array integrity read operation of the non-volatile memory array, the second array integrity read operation comprising reading the array with a word line read voltage that is offset from the first threshold voltage and based on a predetermined width offset reference value;

performing a check sum on the non-volatile memory array subsequent to the second array integrity read operation to provide a check sum value; and checking the check sum value to determine whether an imminent failure of the non-volatile memory is or is not indicated, wherein when the check sum value is equal to a predetermined check sum value an imminent failure in the non-volatile memory array is not indicated, and wherein when the check sum value is not equal to the predetermined check sum value an imminent failure in the non-volatile memory array is indicated.

2. The method of claim 1, wherein the first array integrity read operation is accomplished by performing read operations of the non-volatile memory array while sweeping the word line read voltage within a predetermined range.

3. The method of claim 1, wherein checking the check sum value further comprises the check sum value being a first value when all bits of the non-volatile memory array are programmed, and the check sum value being a second value when all bits of the non-volatile memory array are erased, wherein the first value is not equal to the second value and wherein the first value and the second value are different from any other checksum value associated with the memory array.

4. The method of claim 1, wherein the predetermined width offset reference value is based on a predefined threshold voltage width including a margin.

5. The method of claim 1, wherein the method is performed during a diagnostic mode of the non-volatile memory array.

6. The method of claim 1, further comprising storing the first threshold voltage and the predetermined width offset reference value in predetermined locations of the non-volatile memory array.

7. A system, comprising:
a memory array having a plurality of memory cells, wherein each of the plurality of memory cells is coupled to a word line and a bit line;
a threshold voltage modulator coupled to the word line, wherein the threshold voltage modulator is configured to provide a range of voltage levels to the word line during a diagnostic mode of the system;
an error correction code (ECC) decoder coupled to the memory array; and
a memory controller coupled to the memory array, the threshold voltage modulator, and the ECC decoder, wherein the memory controller is configured to:
perform a first array integrity read operation of the memory array until an error is detected;
determine that the error is not ECC correctable, wherein a first word line voltage associated with the error is characterized as being a first threshold voltage;
perform a second array integrity read operation of the memory array, wherein the second array integrity read operation includes reading the array with a word line read voltage that is offset from the first threshold voltage and is based on a predetermined width offset reference value;
perform a check sum on the non-volatile memory array subsequent to the second array integrity read operation to provide a check sum value; and
check the check sum value to determine whether an imminent failure of the non-volatile memory is or is not indicated, wherein when the check sum value is equal to a predetermined check sum value an imminent failure in the non-volatile memory array is not indicated, and wherein when the check sum value is not equal to the predetermined check sum value an imminent failure in the non-volatile memory array is indicated.

8. The system of claim 7, wherein the first array integrity read operation is accomplished by performing read operations of the memory array while sweeping the word line read voltage within a predetermined range.

9. The system of claim 7, wherein the check sum value is a first value when all bits of the memory array are programmed and the check sum value is a second value when all bits of the memory array are erased, and wherein the first value is not equal to the second value and the first value and the second value are different from any other checksum value associated with the memory array.

10. The system of claim 7, wherein the predetermined width offset reference value is based on a predefined threshold voltage width that includes a margin.

11. The system of claim 7, wherein the memory controller is configured to check the check sum value during a diagnostic mode.

12. The system of claim 7, wherein the first threshold voltage and the predetermined width offset reference value are stored in predetermined locations of the memory array.

13. A non-volatile memory system, comprising:
a non-volatile memory array having a plurality of memory cells, wherein each of the plurality of memory cells is coupled to a word line and a bit line;
a memory controller coupled to the memory array, wherein the memory controller is configured to:
perform a first array integrity read operation of the non-volatile memory array until an error is detected;
determine that the error is not error correction code (ECC) correctable, wherein a first word line voltage associated with the error is characterized as being a first threshold voltage;
perform a second array integrity read operation of the non-volatile memory array, wherein the second array integrity read operation includes reading the array with a word line read voltage that is offset from the first threshold voltage and is based on a predetermined width offset reference value;
perform a check sum on the non-volatile memory array subsequent to the second array integrity read operation to provide a check sum value; and
check the check sum value to determine whether an imminent failure of the non-volatile memory is or is not indicated, wherein when the check sum value is equal to a predetermined check sum value an imminent failure in the non-volatile memory array is not indicated, and wherein when the check sum value is not equal to the predetermined check sum value an imminent failure in the non-volatile memory array is indicated.

14. The system of claim 13, wherein the first array integrity read operation is accomplished by performing read operations of the non-volatile memory array while sweeping the word line read voltage within a predetermined range.

15. The system of claim 13, wherein the check sum value is a first value when all bits of the non-volatile memory array are programmed and the check sum value is a second value when all bits of the non-volatile memory array are erased, and wherein the first value is not equal to the second value and the first value and the second value are different from any other checksum value associated with the memory array.

16. The system of claim 13, wherein the predetermined width offset reference value is based on a predefined threshold voltage width that includes a margin.

17. The system of claim 13, wherein the memory controller is configured to check the check sum value during a diagnostic mode of the non-volatile memory array.

18. The system of claim 13, wherein the first threshold voltage and the predetermined width offset reference value are stored in predetermined locations of the non-volatile memory array.

* * * * *